(12) United States Patent
Lu et al.

(10) Patent No.: US 8,391,059 B2
(45) Date of Patent: Mar. 5, 2013

(54) METHODS FOR OPERATING A SEMICONDUCTOR DEVICE

(75) Inventors: Zhichao Lu, Leuven (BE); Nadine Collaert, Blanden (BE); Marc Aoulaiche, Leuven (BE); Malgorzata Jurczak, Leuven (BE)

(73) Assignee: IMEC, Leuven (BE)

( * ) Notice: Subject to any disclaimer, the term of this patent is extended or adjusted under 35 U.S.C. 154(b) by 137 days.

(21) Appl. No.: 13/168,102

(22) Filed: Jun. 24, 2011

(65) Prior Publication Data

US 2011/0317486 A1  Dec. 29, 2011

Related U.S. Application Data

(60) Provisional application No. 61/358,508, filed on Jun. 25, 2010, provisional application No. 61/419,341, filed on Dec. 3, 2010.

(51) Int. Cl.
 *G11C 11/34* (2006.01)
(52) U.S. Cl. ........ 365/182; 365/129; 365/155; 365/174; 365/177; 365/186; 365/187
(58) Field of Classification Search .................. 365/129, 365/155, 174, 177, 179, 182, 184, 186, 187
See application file for complete search history.

(56) References Cited

U.S. PATENT DOCUMENTS

| 2005/0093154 A1* | 5/2005 | Kottantharayil et al. ..... 257/745 |
| 2007/0211517 A1* | 9/2007 | Burnett ..................... 365/154 |

* cited by examiner

*Primary Examiner* — Fernando Hidalgo
(74) *Attorney, Agent, or Firm* — McDonnell Boehnen Hulbert & Berghoff LLP

(57) ABSTRACT

Multi-gate metal-oxide-semiconductor (MOS) transistors and methods of operating such multi-gate MOS transistors are disclosed. In one embodiment, the multi-gate MOS transistor comprises a first gate associated with a first body factor and comprising a first gate electrode for applying a first gate voltage, and a second gate associated with a second body factor greater than or equal to the first body factor and comprising a second gate electrode for applying a second gate voltage. The multi-gate MOS transistor further comprises a body of semiconductor material between the first dielectric layer and the second dielectric layer, where the semiconductor body comprises a first channel region located close to the first dielectric layer and a second channel region located close to the second dielectric layer. The multi-gate MOS transistor still further comprises a source region and a drain region each having a conductivity type different from a conductivity type of the body.

20 Claims, 9 Drawing Sheets $$I_{hole} = I_{diode} = (M-1)I_D \implies I_{diode} \propto \exp\left(\frac{V_{BS}}{KT/q}\right)$$

$$I_D \propto \exp\left(\frac{V_{GS} - (V_T + \Delta V_T)}{mKT/q}\right) \impliedby \Delta V_T = -r\, \Delta V_{BS}$$

Hole distribution before trigger point
TCAD simulation confirms front gate is in accumulation before latch

METHODS FOR OPERATING A SEMICONDUCTOR DEVICE

CROSS-REFERENCE TO RELATED APPLICATIONS

The present application is a non-provisional of U.S. Provisional Patent Application Ser. No. 61/358,508 filed Jun. 25, 2010 and U.S. Provisional Patent Application Ser. No. 61/419,341 filed Dec. 3, 2010. The contents of U.S. Provisional Patent Application Ser. Nos. 61/358,508 and 61/419,341 are hereby incorporated by reference.

FIELD OF THE INVENTION

The present invention relates to a metal-oxide-semiconductor (MOS) device having multiple gates, and to methods for operating such a semiconductor device.

BACKGROUND

In this specification, the term "MOS" is used in its generally-accepted sense, which is not restricted either to metal (for gate electrodes) or to oxide (for gate dielectrics). A "device" generally refers to a transistor, although it will be understood that transistors are capable of use in many different ways, including as switches in digital circuits and amplifying elements in analog circuits.

Scaling of MOS devices faces considerable challenges as the device dimensions become as small as a few atoms in thickness. In particular, short-channel effects and leakage current become increasing problems. The channel (or channel region) of a MOS transistor (MOSFET) is a conduction zone within a body of the transistor, extending between a source and a drain. Short-channel effects such as drain-induced barrier lowering (DIBL) result from the high electric field strengths resulting within the device as the device dimensions, and thus the channel length, shrink. Leakage current tends to increase exponentially as channel length, and/or the thickness of a gate dielectric (see below) is reduced, making the transistor impossible to turn off completely. Such leakage current may account for a large proportion of the power consumed by an integrated circuit (IC) made up of such devices. Reducing the operating voltage, which is a requirement according to the ITRS (International Technology Roadmap for Semiconductors) only partly mitigates these effects.

Conventionally, MOS devices are planar bulk devices. "Planar" means that the structure is essentially in-plane with the surface of the substrate, and "bulk" means that the body, source and drain are formed within a thick silicon substrate. The source and drain may be made by doping the substrate to form regions of n-type semiconductor material—giving a nMOS; or by forming regions of p-type material giving a pMOS. The body, generally also doped, is of opposite conductivity type to the source and drain. For an nMOS device a p-type channel region may be present, whereas for a pMOS device a n-type channel region may be present. Frequently, nMOS and pMOS devices are combined in the same semiconductor device in a technology called CMOS (Complementary Metal Oxide Semiconductor), to exploit the properties of both types of transistor.

Normally a single gate is formed on top of the body to control the transistor. More precisely, a "gate stack" is constructed comprising a gate electrode of metal or semiconductor material or a combination thereof, on top of gate oxide comprising one or more dielectric layers.

Control of the channel via the gate is of great importance to reduce short-channel effects and leakage current. One approach to enhancing the control afforded by the gate is to reduce the thickness of the dielectric layer (gate oxide); however, this tends to increase the leakage current owing to quantum-mechanical tunneling between the gate electrode and the channel. More stringent gate oxide requirements follow from this, such as the need for materials with a higher dielectric constant.

Another measure is to replace the thick silicon substrate by a relatively thin silicon layer on a substrate of insulating material, so-called silicon-on-insulator (SOI). The insulating material is normally a buried oxide layer, referred to as BOX. A typical standard thickness of the BOX is 145 nm. In this way the gate is able to exert control throughout the volume of the body rather than only in a surface region.

Unlike in bulk devices, the body may be partially depleted of charges (PDSOI)—or, if the body is very thin, fully depleted (FDSOI). In other words little or no doping is required to form the body. This reduces the threshold voltage of the device, which (for an enhancement mode device) is the gate voltage below which no substantial current will flow in the channel. In such a device the body is floating, in other words its potential is independent of that of the substrate. A so-called "floating body effect" is caused by charges accumulating in the body of a PDSOI.

Control of the channel may also be enhanced by equipping the semiconductor device with more than one gate. Not only the body but also the BOX may be made very thin. If the BOX is sufficiently thin (so-called Ultra-Thin BOX or UTBOX of 25 nm or less), it is possible to influence the body via the underside of the structure, for example by implanting a backplane under the BOX. Thus, in such a device a second gate may be formed at the underside or rear of the silicon layer. In such a structure, the top gate is referred to as a "front" gate and the underside or rear gate contact is referred to as a "back" gate. It should be noted that such a back gate need not have the same structure as the top gate. There need not be a well-defined gate stack in the same way as for the top gate, indeed the back gate may be more implicitly than explicitly formed.

It should also be noted that in such multi-gate devices, it is possible to consider more than one channel, each of which may be operating simultaneously in the device. Thus, in a UT device to be discussed it may sometimes be convenient to refer to both a "front" and a "rear" channel. Alternatively, these may be viewed as distinct regions of a single channel. Assuming that the back gate, for example, is held at a steady potential, it is still possible to refer to a single threshold voltage $V_T$ as the voltage level which, as the front gate voltage is "swept" upwards, turns on the front channel.

Devices with ultra-thin body and BOX will be referred to below as UT devices.

An alternative multi-gate structure is the so-called finFET and its variants. This structure may employ the ultra-thin body/BOX referred to above, but rather than provide a second gate on the back of the device, this structure provides the body as a fin of silicon perpendicular to the BOX, allowing multiple gates to be formed along the sides and/or top of the upright fin. By forming gate material at the sides of the fin but not at the top, the gates may be made electrically independent.

Multi-gate transistors including finFETs may also be bulk devices.

The gates of a multi-gate MOS device may have the same, or different, dimensions and properties. That is, different "strengths" of gate may be provided by varying the oxide thickness and/or the work function of the gate electrodes between the respective gates.

The application of voltages to the terminals of a semiconductor device is referred to as "bias" and multiple gate devices may be biased in various ways, including biasing both gates in common, or (if the gates are electrically separated) independently.

Different bias conditions will place the MOS device in one or other of the possible states or modes referred to as accumulation, depletion or inversion. The transitions between these modes are governed by two specific bias voltages (gate voltages, or more correctly voltage difference between gate and source/drain): the threshold voltage $V_T$ mentioned earlier, and a flatband voltage $V_{fb}$. These will now be outlined with reference to a bulk n-channel MOS (nMOS) by way of example.

Assume that the device first has a negative gate potential. Holes are attracted from the semiconductor body to the body/gate oxide interface, owing to negative charge on the gate; this is referred to as accumulation. As the gate voltage rises (becomes more positive) the flatband voltage is reached, and this marks the transition between accumulation and depletion. The term flatband implies that the energy band diagram of the device is flat, i.e. no net charge exists in the body. At this point, the applied gate voltage equals the difference in work function between the gate electrode and the semiconductor.

In the depletion mode (also called the subthreshold region of operation), the positive charge on the gate pushes the holes towards the substrate, leaving the body (at least in the region under the gate) depleted of charge carriers, and forming a depletion layer. The depth of this layer increases as the gate voltage rises. In this mode, the transistor is considered to be turned off; in reality, however, a small subthreshold current flows which is a function of the gate-source voltage.

As the gate voltage rises further beyond the threshold voltage, the depletion mode gives way to inversion, in which a negatively-charged inversion layer is formed at the gate/body interface in addition to the depletion layer. Thus, when the drain-source voltage $V_{DS}$ is sufficient, current flows between the drain and source. (Incidentally, in this specification, the terms drain-source, source-drain and drain voltage are synonymous unless otherwise demanded by the context; thus generally $V_D \equiv V_{Ds}$. In addition, a "channel region" may be referred to for convenience even in the absence of the inversion mode The transistor is now considered to be turned on. As the gate voltage increases, the current increases more or less linearly; thus the transistor acts as an amplifying element, which property is utilised in various analog circuits. Further increase of the applied bias voltages will cause the channel to grow in size, increasing the channel current up to a saturation level, so-called pinch-off.

The above explanation refers to bulk transistors, but the above modes likewise exist also for non-bulk devices. In UT devices the inversion layer can occupy the entire body.

A single channel was assumed for the purposes of the above explanation, but in a multi-gate device, it is possible for the channels (or viewed another way, different regions of a single channel) to be in different modes simultaneously. In fact, the present invention exploits this possibility as will be explained below.

As indicated above, highly-scaled transistors are difficult to turn off completely. As a measure of how easy or difficult it is to reduce the drain current, Subthreshold Slope (SS) is an important parameter. This represents the amount of change in gate-source voltage $V_{gs}$ needed to produce a given change in drain current $I_D$. More formally $SS=d(V_{gs})/d(\log(I_D))$. The smaller the value of SS, the better as the more abrupt is the transition between subthreshold and inversion modes.

Conventional MOS devices cannot provide an SS below 60 mV/decade, and this is a limiting factor on reduction of operating voltage. UT devices including finFETs allow a lower (=better) SS to be obtained because of the improved gate control and absence of doping. Other novel forms of transistor have been proposed to overcome the above limitation on SS, such as the tunneling FET (TFET), Nano-Electro-Mechanical FET (NEMFET), Impact-ionization MOSFET (IMOS) and Feedback FET (FB-FET). Generally these are "asymmetric" devices; that is, properties such as source and drain characteristics, which are the same in conventional, symmetric MOS transistors, differ between the source and drain which necessitates additional processing.

Relying on band-to-band tunneling current, the TFET realizes <60 mV/dec SS at low gate bias. Since SS is a function of gate bias, it is difficult to keep <60 mV/dec SS with current higher than $10^{-10}$ A/μm. Low ON-state current is also another major issue with the TFET.

By utilizing the movement of a mechanical gate, the NEMFET achieves an abrupt SS. However, the mechanical movement limits the operation speed and reliability.

The IMOS achieves a SS of <5 mV/dec as well as high ON-state current via avalanche breakdown. One major drawback of the IMOS is the high operation voltage (even with the use of SiGe as the body material) which leads to severe reliability problems.

The FB-FET has been proposed to reduce the operation voltage. However, like TFET and IMOS, FB-FET is an asymmetrical device which is not compatible with standard CMOS and requires initial programming to set the device states. It also suffers from the reliability problem of charge injection into sidewalls during operation.

As already mentioned, MOS transistors may be employed in various ways in ICs including as switches in logic circuits and amplifiers in analog circuits. Additionally it is possible to use specific kinds of MOS transistor structure as a dynamic random access memory (DRAM) or static random access memory (SRAM).

That is, not only can a MOS transistor be combined with a charge-storing capacitor to form a conventional 1T1C (one transistor, one capacitor) DRAM cell, or combined with other transistors in a latch to form a SRAM cell, but under certain conditions an individual MOS transistor may exhibit an intrinsic memory characteristic and thus form a 1T memory cell, also called capacitorless DRAM. This intrinsic memory characteristic exploits the floating body effect referred to earlier.

Two such specific transistor structures are Z-RAM and the BJT-based floating body cell (FBC).

Z-RAM (Zero-Capacitor RAM) exploits the floating body effect by utilising the variable capacitance which exists between the transistor body and the substrate, this variable capacitance taking the place of the conventional capacitor of a 1T1C cell.

The BJT-based FBC, which offers high sense margin and longer static retention time, has received considerable attention. This device exploits the parasitic bipolar junction transistor (BJT) which, in the equivalent circuit for a MOSFET, exists in parallel with the MOSFET. Conventionally this parasitic BJT is a problem: if the BJT turns ON, it cannot be turned off since the gate has no control over it, so-called "latch-up". The BJT can be turned on due to a voltage drop across the p-type body region, which is normally to be avoided at all costs.

In contrast, the basic idea of the BJT-based FBC is to write '1' by latching the parasitic BJT. However, the high bias conditions which are required to achieve this degrade the reliability significantly. This is especially true for fully depleted devices where the BJT feedback loop can be much weaker as compared to partially depleted devices. Due to the latch occurrence condition, i.e. β(M−1)≧1, where β=parasitic BJT gain and M=impact ionization multiplication factor, the BJT based FBC requires a high operation voltage. A bias of up to 3.6V is needed to get the hysteresis window, and significant degradation is linked to this high $V_{DS}$. Moreover, the need for relatively high bias voltages conflicts with the drive towards lower operating voltages of ICs.

Consequently, it would be highly desirable to provide a semiconductor device capable of acting as a 1T memory cell without requiring high bias voltages.

It would further be highly desirable to provide an integrated circuit with identically-fabricated semiconductor devices capable of use as either 1T memory cells, logic switches or analog elements, depending only on the biasing scheme used.

SUMMARY

According to a first aspect of the present invention, there is provided a method for programming a semiconductor memory device in the form of a multigate MOS transistor having a threshold voltage, the device comprising:
  a first gate associated with a first body factor, the first gate comprising a first gate electrode for applying a first gate voltage, in contact with a first dielectric layer;
  a second gate associated with a second body factor, the second gate comprising a second gate electrode for applying a second gate voltage, in contact with a second dielectric layer, wherein said second body factor is larger than or equal to said first body factor;
  a body of semiconductor material between the first dielectric layer and the second dielectric layer, the semiconductor body having a bandgap and comprising a first channel region which is located close to the first dielectric layer and a second channel region which is located close to the second dielectric layer; and
  a source and a drain region having a conductivity type different from that of the body;
  the method comprising:
    providing at least said second body factor sufficient to enable a threshold-voltage based feedback loop of generation of charge carriers in the body, such as to create a hysteresis window in the variation of drain current with first gate voltage;
    performing a first write operation by placing the first channel region in accumulation mode and the second channel region in depletion or inversion mode and by applying a drain-to-source voltage larger than the bandgap of the semiconductor body, thereby generating charge carriers by impact ionization and inducing said feedback loop;
    performing a second write operation by placing the first channel region in depletion or inversion mode and the second channel region in depletion or inversion mode and by applying a forward biasing drain-to-source voltage;
    performing a read operation by placing the first channel region in accumulation mode and the second channel region in depletion or inversion mode, applying a drain voltage larger than the bandgap of the semiconductor body, and applying the first gate voltage within the hysteresis window; and performing a hold operation by reducing the first gate voltage below the threshold voltage of the device, the second channel region being in depletion or inversion mode and with no voltage difference between the source and drain regions;
    wherein in each of the performing steps, a second gate voltage of opposite polarity to the first gate voltage is applied.

According to a second aspect of the invention, there is provided a method of operating an integrated circuit including a plurality of identically-fabricated multigate MOS transistors each comprising: a first gate associated with a first body factor, the first gate comprising a first gate electrode for applying a first gate voltage, in contact with a first dielectric layer; a second gate associated with a second body factor, the second gate comprising a second gate electrode for applying a second gate voltage, in contact with a second dielectric layer, wherein said second body factor is larger than or equal to said first body factor; a body of semiconductor material between the first dielectric layer and the second dielectric layer, the semiconductor body having a bandgap and comprising a first channel region which is located close to the first dielectric layer and a second channel region which is located close to the second dielectric layer; and a source and a drain region having a conductivity type different from that of the body;
    wherein some of the multigate MOS transistors are operated as semiconductor memory devices in accordance with the method of the first aspect and others of the transistors are operated as logic devices by:
    placing the first channel region in accumulation mode and the second channel region in depletion or inversion mode without inducing said feedback loop;
    applying a negative write voltage to the first gate electrode;
    applying a positive write voltage to the second gate electrode; and
    applying a drain-to-source voltage higher than the bandgap of the semiconductor material in the semiconductor body.

According to a third aspect of the present invention, there is provided a semiconductor circuit comprising a plurality of identically-fabricated multigate MOS transistors each comprising: a first gate associated with a first body factor, the first gate comprising a first gate electrode for applying a first gate voltage, in contact with a first dielectric layer; a second gate associated with a second body factor, the second gate comprising a second gate electrode for applying a second gate voltage, in contact with a second dielectric layer, wherein said second body factor is larger than or equal to said first body factor; a body of semiconductor material between the first dielectric layer and the second dielectric layer, the semiconductor body having a bandgap and comprising a first channel region which is located close to the first dielectric layer and a second channel region which is located close to the second dielectric layer; and a source and a drain region having a conductivity type different from that of the body:
    a first biasing means for operating a first subset of the transistors as semiconductor memory devices in accordance with the method of the first or second aspect; and
    a second biasing means for operating a second subset of the transistors as logic devices by:
    placing the first channel region in accumulation mode and the second channel region in depletion or inversion mode without inducing said feedback loop;
    applying a negative write voltage to the first gate electrode;
    applying a positive write voltage to the second gate electrode; and applying a drain-to-source voltage higher than the bandgap of the semiconductor material in the semiconductor body.

According to a fourth aspect of the present invention, there is provided a multi-gate MOS transistor comprising:
a body;
source and drain terminals at opposite ends of the body;
a first gate, defined between the source and gate terminals at one side of the body, for controlling a first channel in at least a part of the body close to the first gate, and associated with a first body factor;
a second gate, defined between the source and gate terminals at another side of the body, for controlling a second channel in at least a part of the body close to the second gate, and associated with a second body factor having a value of at least 0.8;
the first gate arranged to receive a first bias voltage having a first polarity and selectable between a value for placing the first channel region in an accumulation state and a value for placing the first channel region in a depletion or inversion state;
the second gate arranged to receive a second bias voltage having a second polarity opposite to the first polarity and a value for placing the second channel region in a depletion or inversion state.

In the above, it is to be understood that a step of "placing" a channel region in a particular state includes "keeping" the existing state, if that is the same as the state required.

Thus, one embodiment of the present invention is a method for programming a semiconductor device, the method comprising a write '1' operation, a write '0' operation, a read operation and a hold operation.

The semiconductor device may comprise: a first gate stack characterized by a body factor R1, the first gate stack comprising a first gate electrode in contact with a first dielectric layer; a second gate stack characterized by a body factor R2, the second gate stack comprising a second gate electrode in contact with a second dielectric layer wherein body factor R2 is larger or equal to body factor R1; a semiconductor body region sandwiched in between the first dielectric layer of the first gate stack and the second dielectric layer of the second gate stack, the semiconductor body comprising a first channel region which is located close to the first dielectric layer and a second channel region which is located close to the second dielectric layer; and a source and a drain region having a conductivity type opposite from that of the semiconductor body.

The method may comprise:
performing a write '1' operation by bringing the first channel region in accumulation mode or depletion mode or inversion mode and the second channel region in depletion or inversion mode and by applying a drain voltage larger than the bandgap of the semiconductor body thereby generating holes by impact ionization and inducing a feedback loop;
performing a write '0' operation by bringing the first channel region in depletion or inversion mode and keeping the second channel region in depletion or inversion mode and by forward biasing of the semiconductor body region to source and/or drain;
performing a read operation by bringing the first channel region in accumulation mode and the second channel region in depletion or inversion mode and by applying a drain voltage larger than the bandgap of the semiconductor body; wherein the voltage applied to the first gate electrode of the channel region which is in accumulation needs to be taken within the hysteresis window (which is typically more negative than the voltage applied to the first gate electrode of the write '1' operation for an nMOS semiconductor device or which is typically more positive than the voltage applied to the first gate electrode of the write '1' operation for an pMOS semiconductor device); and
performing a hold operation by reducing the voltage applied to the first gate electrode below the threshold voltage of the device; the second channel region being kept in depletion or inversion mode and wherein the voltage applied to the source and drain region are kept at 0 Volts.

In this method, for a nMOS or pMOS semiconductor device a positive or negative voltage respectively is applied to the second gate electrode in the step of performing a write '1' operation and in the step of performing a write '0' operation and in the step of performing a read operation and in the step of performing a hold operation, wherein the value of the positive or negative voltage is the same for the step of performing a write '1' operation and for the step of performing a write '0' operation and for the step of performing a read operation and the step of performing a hold operation.

In another embodiment of the present invention the semiconductor device is considered to have a single body factor r, and a method for operating a MOS device comprises: providing a MOS device according to any of the structures already outlined, the semiconductor device comprising a first gate electrode and a second gate electrode; the first gate electrode and the second gate electrode not being in electrical contact with each other; the MOS device having a body factor r larger than 0.8; and applying a first voltage to the first gate electrode and a second voltage to the second gate electrode whereby the first and second voltage have an opposite sign.

Embodiments of the present invention exploit a hysteresis window in the characteristic of drain current versus front gate voltage (where "front gate" is a label for one of the gate electrodes of a multi-gate device, also called the "first" gate). That is, the hysteresis window of a semiconductor device may be defined as the program window of the $I_D$ versus $V_{FG}$ curve. This is for example shown in FIG. 5 of the accompanying drawings. By making the program window as large as possible a read operation is possible for the device.

The write '1' or write '0' operation are for storing information in the semiconductor body region. Here '1' and '0' values are purely notional and could of course be reversed. The read operation is for reading information stored in the semiconductor body region.

The voltages applied may be a DC voltage (e.g. for providing a SRAM) or a voltage in pulse form (e.g. for a DRAM).

The device can be a planar device whereby the at least two gate electrodes are parallel to the substrate on which the semiconductor device is present.

The device can be a FinFET device whereby these at least two gate electrodes are perpendicular to the substrate on which the semiconductor device is present.

The device can be a MOSFET formed on semiconductor-on-insulator substrate whereby the gate electrode and the substrate electrode are the opposing gate electrodes.

A plurality of the above devices may be provided in an integrated circuit along with means for biasing the gate electrodes, whereby the means for biasing the opposing gate electrodes are configured to apply voltages with opposite sign respectively to the opposing gate electrodes, i.e. a positive voltage to one of the opposing gate electrodes and a negative voltage to the other opposing gate electrode.

The first gate electrode may be the gate region of the semiconductor device which is in capacitively coupled contact with the body via the gate dielectric layer, whereas the second gate region may be the back gate region or substrate region of the semiconductor device. The second gate region may also be in capacitively coupled contact with the body via another dielectric layer, this another dielectric layer being different from the gate dielectric layer. The another dielectric layer may for example be the buried oxide (BOX) region of an SOI MOS device.

The gate voltages are preferably chosen such that the operation of the semiconductor device is in the subthreshold region, i.e. below the threshold voltage of the semiconductor device. By "threshold voltage" is meant the voltage below which substantially no current flows through the semiconductor device, i.e. where the semiconductor device is in steady state also called in equilibrium when the device is not triggered. Otherwise said, according to certain embodiments the gate voltages are chosen such that the operating of the semiconductor device is in the accumulation region for a n-type semiconductor device, meaning that holes are accumulated in the body at one of the first or the second gate.

The method may further comprise applying a source/drain voltage $V_{DS}$ lower or equal to 1.5 Volts between the source and drain region.

It is an advantage of at least some embodiments of the present invention that a subthreshold swing lower than 60 mV/decade can be achieved. By applying a voltage to the second gate electrode (i.e. the back bias) a steep sub-threshold swing may be induced for a logic analog or digital semiconductor device, and/or a hysteresis may be induced which is necessary for memory semiconductor devices. In this way, it becomes possible to integrate both logic and memory applications on the same chip without additional cost.

It is an advantage of at least some embodiments of the present invention that the (first) gate dielectric requirements may be relaxed, which means the need for advanced gate stacks using for example high-k gate dielectric material is reduced.

It is an advantage of at least some embodiments of the present invention that a low drain voltage may be applied in order to achieve a hysteresis window for memory applications, compared with voltages required by previously-proposed capacitorless memory cells.

It is an advantage of at least some embodiments of the present invention to provide a low voltage floating body biasing scheme.

It is an advantage of at least some embodiments of the present invention that the source-drain voltage ($V_{DS}$) may be reduced to values lower than 1.5 Volt in accordance with ITRS requirements. It is a further advantage that retention times may be kept high (i.e. higher than 0.1 seconds) while applying low $V_{DS}$.

It is an advantage of at least some embodiments of the present invention that a high endurance performance may be met, i.e. more than $10^{16}$ cycles as a result of the $V_{DS}$ reduction.

It is an advantage of at least some embodiments of the present invention that a conventional symmetric MOSFET architecture may be used. As a consequence also scalability is improved.

It is an advantage that the proposed biasing scheme may be used for different semiconductor materials, such as for example, silicon, germanium, or III-V materials.

BRIEF DESCRIPTION OF THE DRAWINGS

Reference is made, by way of example only, to the accompanying drawings in which.

DETAILED DESCRIPTION

Before describing embodiments of the present invention, some example device structures, to which the present invention may be applied, will first be outlined.

Figure 1:
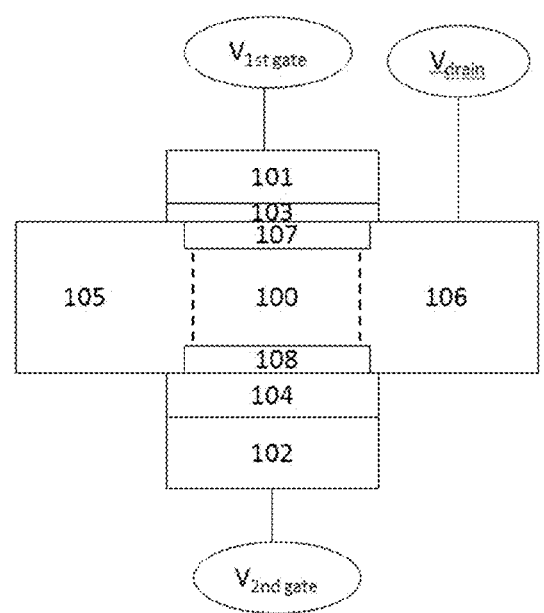
FIG. 1 shows a MOS transistor structure to which the present invention may be applied.

FIG. 1 shows a generic MOS transistor structure with a semiconductor body 100 in electrical contact with a source 105 and drain 106 region for conveying electrical charge to and from the body 100. The source 105 and drain 106 region are positioned at opposite sides of the body 100. The semiconductor memory device further comprises a first gate stack and a second gate stack. The first gate stack comprises a first gate electrode 101 and a first dielectric layer 103. The second gate stack comprises a second gate 102 electrode and a second dielectric layer 104.

The first and second gate electrodes 101, 102 are capacitively coupled to the body 100, thereby forming respectively a first channel region 107 and a second channel region 108. The first and second gate electrodes 101, 102 are positioned at opposite sides of the body 100 such that the gate electrodes can be biased independently. Each gate electrode 101, 102 is separated from the body 100 by a dielectric layer 103, 104 respectively. The semiconductor body 100 is thus sandwiched in between the first 103 and the second 104 dielectric layer.

The semiconductor device is characterized by a body factor, more specifically by a first body factor R1 and/or a second body factor R2. The body factor R in general expresses the dependency of the threshold voltage associated with a gate stack and channel on the body voltage (region 100). The body factor R is dependent on the semiconductor body film thickness, on the gate dielectric thickness, channel length (which is thus the separation between source and drain region). The work function of the gate will have an impact on the absolute voltages at which the (first) gate is in accumulation or in depletion as these voltages will be shifted proportional to the gate work function.

In embodiments of the present invention, the first body factor R1 is related to the capacitance of the first and second gate dielectric stack. The body factor $R1=C_{second}/C_{first}$, where the first gate electrode is the principal gate electrode of the semiconductor device and the second gate electrode is the secondary gate electrode.

The second body factor R2 is related to the capacitance of the first and second gate dielectric stack. The body factor $R2=C_{first}/C_{second}$, where the second gate electrode is the principal gate electrode of the semiconductor device and the first gate electrode is the secondary gate electrode.

Here, $1/C_{second}=1/C_{box}+1/C_{semi}$ when the second gate stack is in inversion or accumulation, and $1/C_{second}=1/C_{box}+1/C_{semi}+1/C_{dep}$ in the case of a buried-oxide (BOX) region for the second dielectric layer. $C_{first}$ is the capacitance for the first gate stack with the first dielectric layer, $C_{second}$ is the capacitance for the second gate stack which is a series of the capacitance of the second dielectric layer ($C_{box}$ in case the second dielectric layer comprises the BOX region of the SOI-based semiconductor device) and the capacitance of the semiconductor body region ($C_{semi}$) when the second gate stack is in inversion and/or accumulation. When the second gate stack is in depletion, also the capacitance of the depletion layer ($C_{dep}$) which is created in the second gate stack needs to be taken into account.

In some embodiments, the body factor may be equal to or larger than 0.8, or even equal to or larger than 1.

The body factor R1 may be smaller than or equal to the body factor R2. This may be accomplished by fabricating the first gate stack with a higher capacitance than the series connection of the second gate stack capacitance with the semiconductor body capacitance. This may in turn be accomplished by, for example, fabricating a first dielectric layer 103 which is smaller than the second dielectric layer 104, or by, for example tuning the thickness of the semiconductor body region 100 or the channel length (which is related to the width of the semiconductor body region 100) or the work function of the first 101 and/or second 102 gate.

Figure 2:
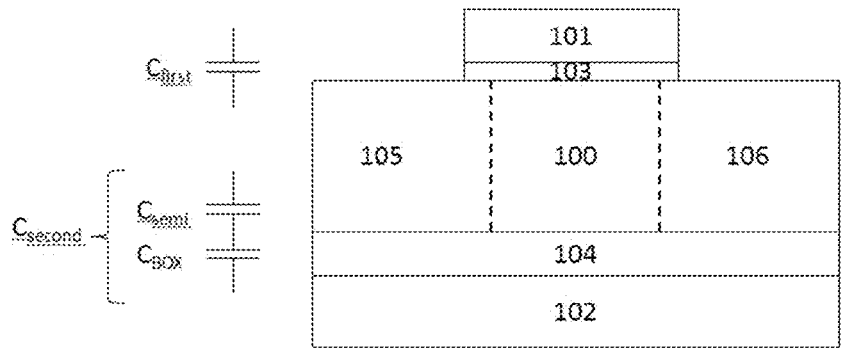
FIG. 2 shows a FDSOI semiconductor device as an embodiment of the present invention.
Figure 3:
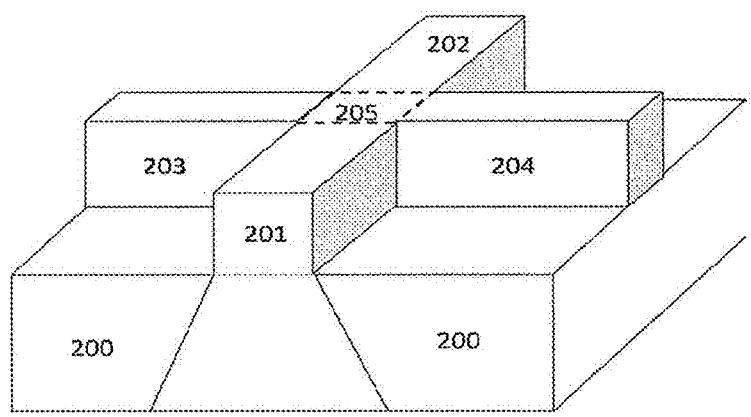
FIG. 3 shows a finFET as another embodiment of the present invention.

FIGS. 2 and 3 show more specific examples of transistor structures to which the present invention may be applied.

FIG. 2 illustrates a fully depleted semiconductor on insulator (FDSOI) device in which the first 103 and second 104 gate dielectric layers comprise the same insulating material. In this case the body factor R2 is proportional to:

$$\frac{3t_{BOX}}{t_{semi}+3t_{gox}},$$

and the body factor R1 is proportional to:

$$\frac{3t_{gox}}{t_{semi}+3t_{BOX}},$$

where $t_{BOX}$ is the thickness of the buried-oxide (BOX) region 104 of the FDSOI device, $t_{semi}$ is the thickness of the semiconductor body (which in this instance is equivalent to the thickness of the channel layer) 100 of the FDSOI device and $t_{gox}$ is the thickness of the gate oxide layer 103.

At the first gate electrode 101 a voltage $V_{1stgate}$ may be applied. At the second gate electrode 102—which may be a common back electrode shared by other transistors—a voltage $V_{2ndgate}$ may be applied. At the drain region 106 a voltage $V_{drain}$ may be applied (while keeping the voltage at the source region 105 at 0 V); or conversely at the source region 105 a voltage $V_{source}$ may be applied (while keeping the voltage at the drain region 106 at 0 V).

In this FDSOI device structure, the second gate electrode 102 is formed under the BOX and is thus referred to as a back gate. The first gate electrode 101 is then referred to as the front gate. Consequently $V_{1stgate}$ may also be referred to as the front gate voltage $V_{FG}$, whereas $V_{2ndgate}$ may also be referred to as the back gate voltage $V_{BG}$ or substrate voltage $V_S$.

The semiconductor device may be a double-gate finFET device as schematically shown in FIG. 3. A first gate 203 and a second gate 204 are present at both sides of the body 205 of the fin. Along the fin a source region (and source electrode) 201, a body region (channel region) 205 and a drain region (and drain electrode) 202 is present. Dielectric regions 200 form an electrical isolation region between the first and the second gate electrode. Also a gate dielectric layer is present around the channel region of the fin (not shown).

The dielectric regions may be provided either by the substrate in a bulk device, or by the BOX in a SOI.

In an alternative tri-gate finFET device structure (not shown), front and back gates are formed in a similar manner to that shown in FIG. 2. Here, the first gate surrounds the body region of the fin (i.e. at the sidewall surface as well as the top surface of the body/channel region of the fin). The second gate electrode may be at the back of the device, as such forming a back gate (electrode). This will generally be a UT device to allow the back gate to be effective.

An embodiment of the present invention provides a capacitorless memory cell using one of the above device structures and requiring relatively low bias voltages. To achieve this, for the write '1' operation a sub-threshold positive feedback loop—called the $V_T$-feedback loop—is used. Factors to induce this feedback loop are:
  the need for an accumulation layer to link $\Delta V_T$ and $\Delta V_{BG}$ where $V_{BG}$ is the back gate voltage,
  a body factor which is large enough to provide loop gain, i.e. $\geq 0.8$, more preferably larger than 1, and
  an initial finite sub-threshold current to generate enough hole current.

Figures 4A, 4B:
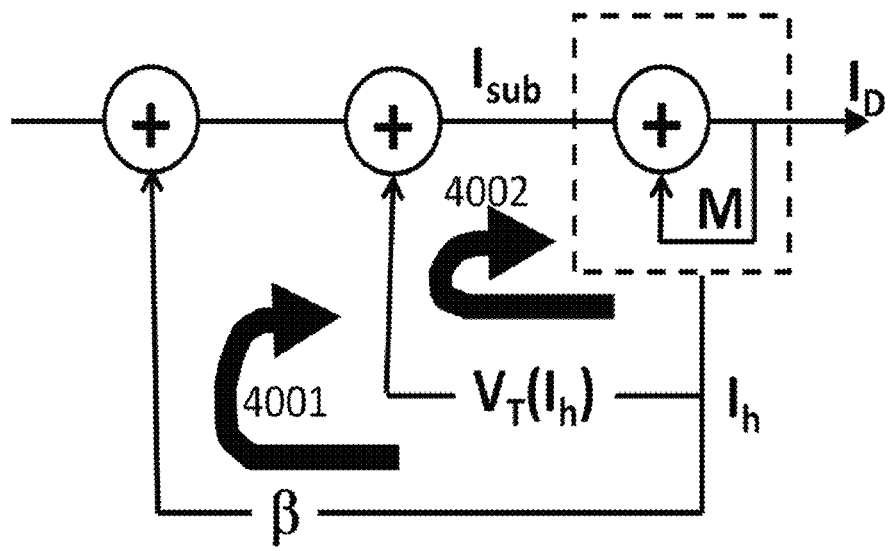
FIG. 4A shows β and $V_T$ feedback loops in a body of a semiconductor device.
FIG. 4B shows the mechanism underlying the $V_T$ feedback loop shown in FIG. 4A.

FIG. 4A shows two possible feedback mechanisms for generation of charge carriers in the channel of a MOS device. One of these is called a β-feedback loop 4001, and this is the mechanism employed in the BJT-based FBC mentioned above. However, embodiments of the present invention employ another feedback mechanism called the $V_T$-feedback loop 4002. The inventors of the present application have discovered that by significantly lowering the $V_{DS}$, a superior endurance performance over the BJT-based FBC can be achieved without compromising the retention time and sense margin.

FIG. 4B shows the inter-related phenomena which give rise to the $V_T$-feedback loop. In the formulas described in FIG. 4B, $I_{hole}$ refers to the hole current, $I_D$ to the drain current, $V_{GS}$ to the front gate voltage (also denoted by $V_{FG}$ elsewhere in this specification), $V_{BS}$ to the body-to-source voltage (which is determined by the back gate voltage $V_{BG}$), $V_T$ to the threshold voltage (of the front channel), and r to the body factor.

When the device is biased in the subthreshold region, as the electrons diffuse to drain side, impact ionization occurs and holes are swept into the body, thereby raising body voltage ($V_{BS}$). It should be noted that this effect is tantamount to a virtual increase in channel doping, so that a FDSOI device becomes like a quasi-PDSOI.

The increased $V_{BS}$ in turn decreases $V_T$ of the MOSFET. The reduction of $V_T$ causes the increase of $I_{DS}$ and more impact ionization current. More holes are injected to body and raise the $V_{BS}$ further. Because of this positive feedback, a super-steep SS is realized. A similar mechanism induces the turn-off process but in the opposite direction. Since the device relies on the positive feedback process and weak impact ionization, the operation speed is faster and more reliable compared to the above-mentioned IMOS, for example.

The $V_T$ is linked to $V_{BS}$ by body factor r, i.e., $\Delta V_T = -r\Delta V_{BS}$ as shown in FIG. 4B. In fact, the $V_T$—feedback loop is typically undiscerned because MOSFETs proposed previously have been designed for logic applications with a body factor ~0.3, which is not large enough to produce the positive feedback. Therefore, in order to enhance feedback efficiency and achieve a super-steep SS at low drain bias, unlike conventional MOSFETs, it is very important to design the device with relative large body factor(s).

Figure 5A:
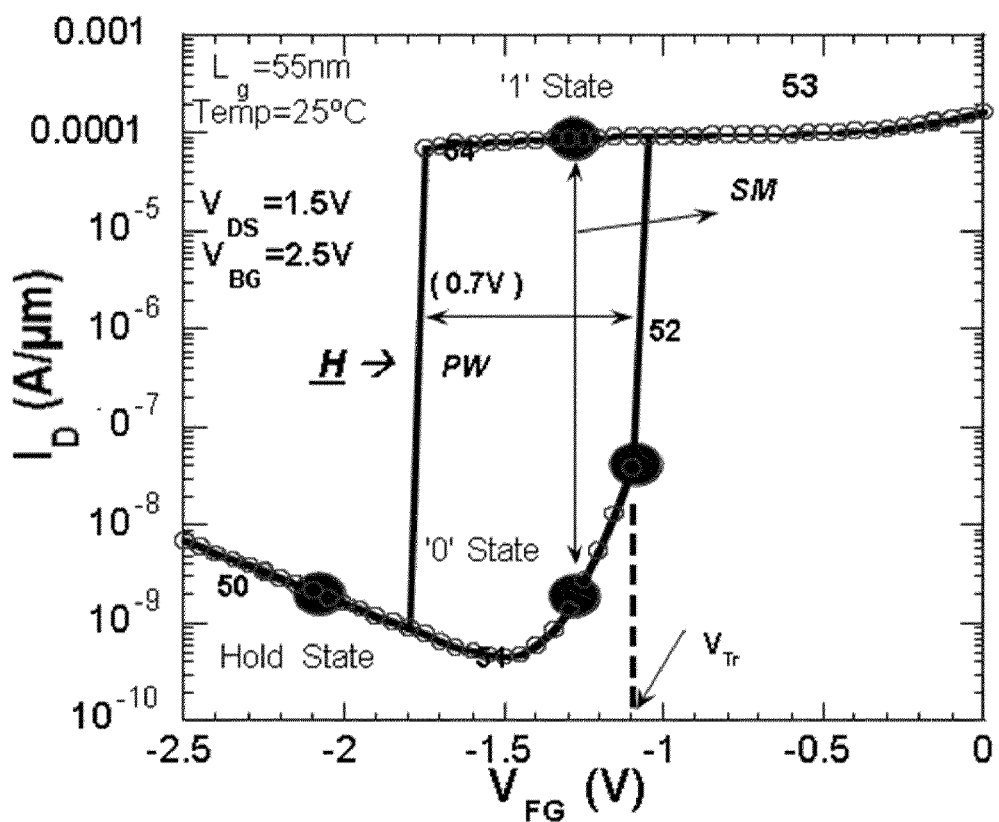
FIG. 5A shows a hysteresis window in a variation of drain current with a front gate (first gate) voltage, exhibited by a device embodying the present invention.
Figure 5B:
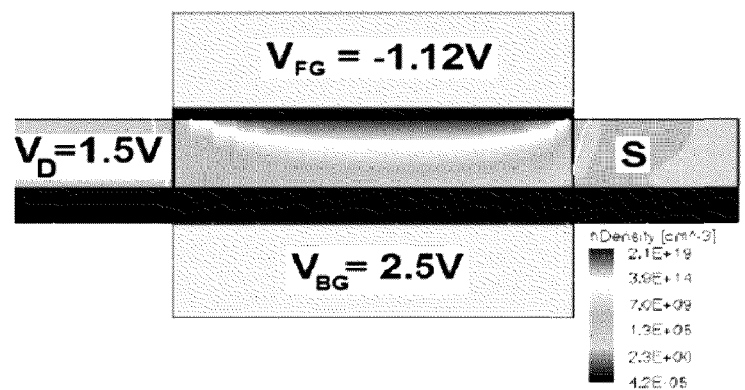
FIG. 5B shows a hole distribution in the body of a semiconductor device just before a Trigger Point shown in FIG. 5A.

FIGS. 5A and 5B illustrate a hysteresis effect linked to the above feedback loop.

FIG. 5A shows what happens as the front gate voltage $V_{FG}$ is increased (swept forward), keeping the back gate at a constant bias voltage of opposite polarity. Starting with a low (highly negative) value of $V_{FG}$, the drain current is at a low level as indicated at 50 in the Figure. This reflects the fact that the front channel is in accumulation (below −2V In this example). The drain current stays at a low level and even reduces as initially as indicated at 51, before starting to increase gradually until a trigger point TP is reached at a certain voltage $V_{Tr}$. (Note that $V_{Tr}$ is not quite the same as $V_T$, since the threshold voltage $V_T$ is variable as explained above). At this trigger point TP the current abruptly increases as indicated by the near-vertical line 52 in FIG. 5A to a high level, at which it remains, as indicated at 53, even under further increase in the gate voltage. Note that this current 53 has a level ~100 µA/µm, which is high compared to other devices from this class.

However, the behaviour when the gate voltage is now reduced (scanned in reverse) is different. As indicated at 54, the drain current stays high even as the gate voltage $V_{FG}$ reduces below the trigger voltage $V_{Tr}$, down to a value of (in this example) around −1.7V At this point the device returns, as shown by line 55 to the subthreshold operation region and the current drops abruptly back to the initial level indicated by 51. The result is the hysteresis curve shown in FIG. 5A. The width of the hysteresis curve (around 0.7V in this example) is called the program window PW, and represents the voltage range within which it is possible to distinguish two alternate states of the device. These states reflect the presence or absence of large numbers of holes injected to the body. As shown in FIG. 5A, the high level of drain current $I_D$ at 54 is used to represent a '1' and the low level portion of the hysteresis curve at 51 is used to represent a '0'. The part 50 of the $I_D$ curve before the hysteresis window (at more negative values of $V_{FG}$) is used as a Hold state as indicated on FIG. 5A.

Meanwhile, the height of the hysteresis curve on the $I_D$ axis represents the sense margin (shown as SM in FIG. 5A), in other words the difference in magnitude of current $I_D$ between the '1' and '0' states. (Since FIG. 5A shows current on a log scale, this difference is expressed as the ratio of '1' state to '0' state $I_D$). This difference can be detected by a sense amplifier of a memory circuit, provided of course that $V_{FG}$ is within the program window.

FIG. 5B shows the hole distribution just before the trigger point $V_{Tr}$. It can be seen that the hysteresis occurs (in case of an nMOS semiconductor device) when the front channel—or that part of the channel close to the front gate—is in accumulation and when the back channel (part of the channel close to the back gate) is in depletion. In this state, the device behaves as a quasi-PDSOI device. A large body factor is helpful to trigger the $V_T$-feedback loop as already mentioned.

Figure 6:
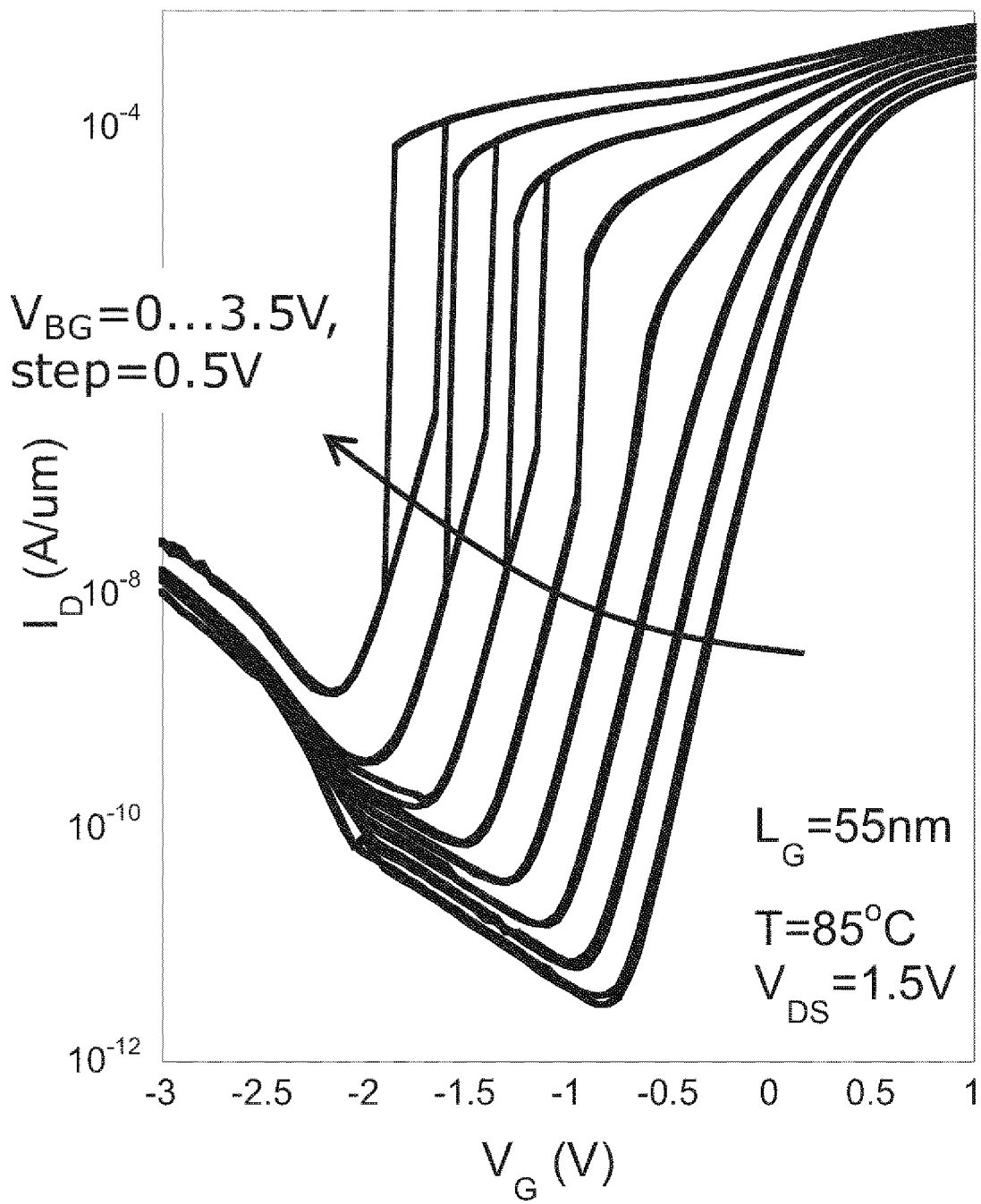
FIG. 6 shows the effect of varying a second gate (back gate) voltage upon the hysteresis window.

FIG. 6 shows the effect on the hysteresis window of varying the back gate voltage. A value of $V_{BG}$=2.5V was assumed in FIG. 5A. As can be seen from FIG. 6, the program window narrows as $V_{BG}$ is reduced, becoming negligible at around $V_{BG}$=1V in this example. As explained later, this allows the possibility of biasing devices in different ways so as either to exhibit or not exhibit the hysteresis window as required—in other words, depending on whether the devices are to be used as a memory or not.

A memory cell requires, at a minimum, the ability to write a value of '1' or '0'; to read out the value stored; and to hold the stored value for a greater or lesser time depending on whether the device is to act as a DRAM or SRAM.

Thus, as described more fully below, a write '1' operation may be achieved by applying a specific biasing scheme to the semiconductor memory device. The biasing scheme involves biasing the first gate electrode, the second gate electrode and the drain region, or alternatively the source, or both source and drain. (Below reference will be made to simply the drain voltage for simplicity). In the case of an nMOS semiconductor device, by applying a negative voltage to the first gate electrode, the first channel region may be brought into accumulation mode (i.e. an accumulation of holes for nMOS). By applying a positive voltage to the second gate electrode (or the gate electrode with the highest body factor, i.e. for example the one with the thickest dielectric layer) the second channel region may be brought into depletion or inversion mode. Incidentally, it is assumed that the back gate is associated with the higher body factor for present purposes. By applying a voltage to the drain (and keeping the source region at 0V) a current may flow through the body region 100. The drain voltage should be higher than the bandgap energy of the semiconductor material of the semiconductor body in order to get impact ionization.

Likewise, a write '0' operation may be achieved by applying a different biasing scheme to the semiconductor device. In the case of an nMOS semiconductor device, this can be achieved by forward biasing of the body region to drain and/or source junction. Although the body potential cannot be controlled directly, it is influenced by the amount of charges injected to the body, which depends in turn on the front and back gate voltages. Another way is to use capacitive coupling where source and drain are kept at 0V and the first gate is put in inversion either removing the holes or supplying a large amount of electrons which will recombine with the holes.

The read operation may be achieved by applying a specific biasing scheme to the semiconductor memory device. In the case of an nMOS semiconductor device, the drain voltage during the read operation is the same as the drain voltage during the write '1' operation and the gate voltage of the second gate during this read operation is the same as the second gate voltage during write '1'. The gate voltage of the first gate during the read operation is lower than the gate voltage in the write '1' operation.

The hold operation may be achieved by applying a specific biasing scheme to the semiconductor memory device. In case of an nMOS semiconductor device, the voltage applied between the source and drain region is preferably kept at 0 Volts. The first gate voltage is kept lower or equal to 0V while the second gate voltage is equal to the gate voltage of the second gate during write '1'. It should be noted that $V_{BS}$ here (voltage between back gate electrode and source) is equivalent to $V_{BG}$ referred to elsewhere.

Summarized, the biasing scheme for operating a nMOS semiconductor memory device may be as follows:

|  | Write 1 | Write 0 | Read | Hold |
|---|---|---|---|---|
| $V_{gate1}$ | $V_{write11} < 0$ | $V_{write01} > 0$ | $V_{read1} < V_{write11}$ | $V_{hold1} \leq 0$ |
| $V_{gate2}$ | $V_{write12} > 0$ | $V_{write02} = V_{write12}$ | $V_{read2} = V_{write12}$ | $V_{hold2} = V_{write12}$ |
| $V_{ds}$ | $V_{write13} > E_{bandgap}$ | $V_{write03} \leq 0$ | $V_{read3} \geq V_{write13}$ | $V_{hold3} = 0$ |

The first gate electrode may also be referred to as the charge storage node whereas the second gate electrode may also be referred to as the programming node of the semiconductor memory device.

The biasing scheme for programming a semiconductor device will now be described in more detail, more specifically for a nMOS semiconductor device. A person skilled in the art may adapt the nMOS biasing scheme mutatis mutandis for a pMOS semiconductor device, which means for example that negative voltages applied for nMOS become positive voltages applied for pMOS. In the following description, the "channel region" is a region of the body adjacent to a gate, which may be considered to exist in any operation mode of the device, and in which a current flows when in the inversion mode. Also, references to "bringing" or "keeping" a channel region in a particular state are purely illustrative and not limiting. Depending on the previous operation of the device, "bringing" it into a certain state may involve maintaining an existing state.

Figure 7:
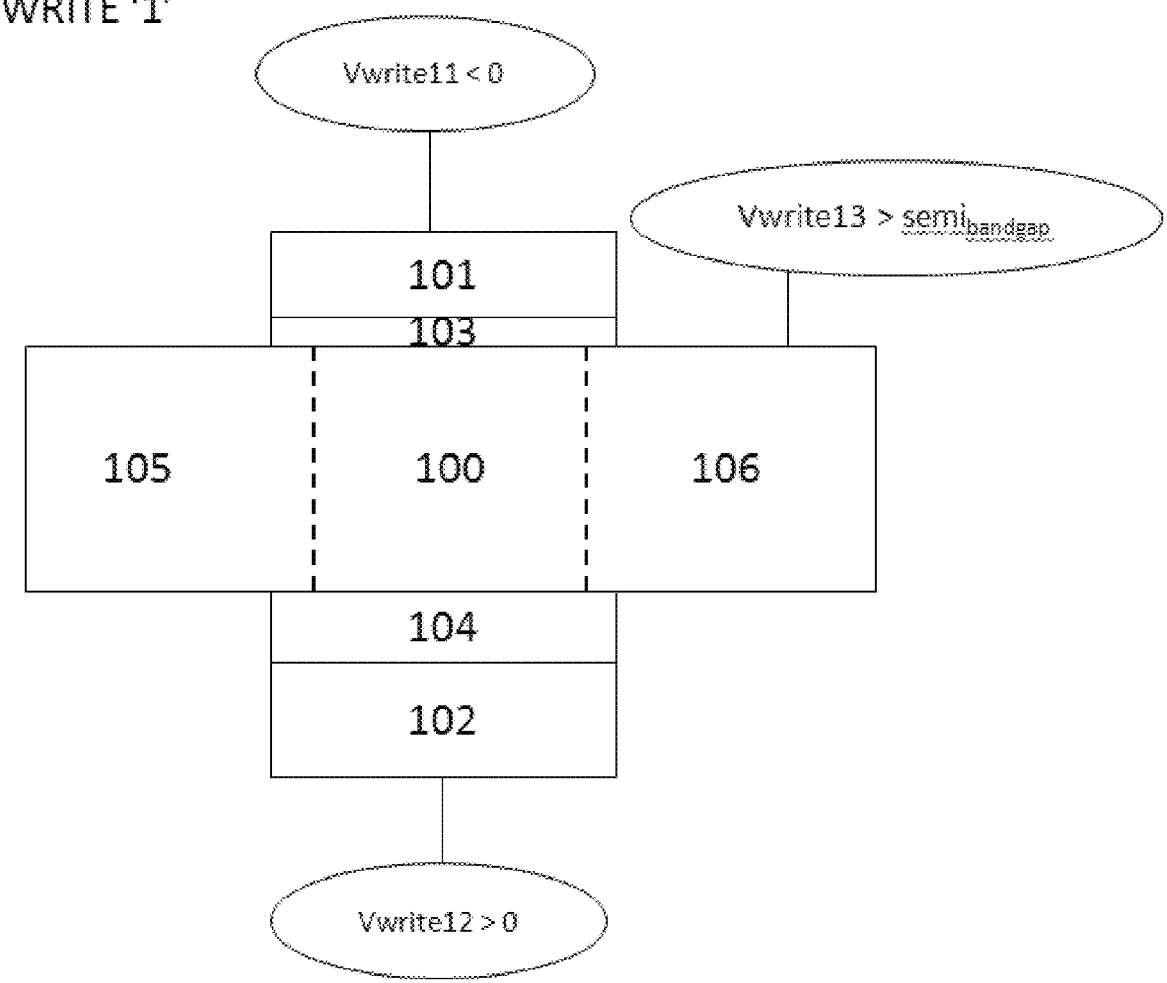
FIG. 7 shows voltages applied to the MOS transistor structure of FIG. 1 to perform a write '1' operation of a semiconductor memory device.

FIG. 7 shows the same generic device structure as FIG. 1, the only difference being the labelling of bias voltages applied to the device terminals as "Vwrite11" and so forth. The same bias voltage labels, when used in different Figures, are intended to refer to the same or similar potentials.

A specific voltage scheme for write '1' mode for an nMOS semiconductor device, illustrated in FIG. 7, is as follows.

Bringing the first channel region in accumulation mode or depletion mode or inversion mode and the second channel in depletion or inversion mode comprises:

applying a negative write11 voltage to the first gate electrode applying a positive write12 voltage to the second gate electrode and applying a write13 drain (or source) voltage to the drain (or source) region, the write13 drain (or source) voltage being higher than the bandgap of the semiconductor material in the semiconductor body.

The write 11 voltage applied to the first gate electrode should be higher—that is, less negative—than the so-called trigger voltage $V_{Tr}$, i.e. the voltage at which a threshold slope occurs in the $I_D$ versus $V_{FG}$ curve (see FIG. 5A). The write11 voltage may therefore be in a range wherein the first channel region may be in accumulation mode or in depletion mode or in inversion mode, depending whether the write11 voltage is negative or positive. Preferably the write11 voltage is equal or higher than 0V. It is important that during the step of bringing the first channel in accumulation, depletion or inversion mode that holes are created in the first channel region.

The body factor R1 is preferably smaller than body factor R2. The channel region with the lowest body factor, i.e. thus R1, the first channel region is preferably brought into accumulation for the write '1' operation. In the case of a nMOS semiconductor device, holes will be provided in the first channel region (which is in accumulation) during the write '1' operation, whereas in the case of a pMOS semiconductor device electrons will be provided in the first channel region (which is in accumulation) during the write '1' operation. Similarly, in the case of a nMOS semiconductor device, electrons will be provided in the second channel region during the write '1' operation, whereas in the case of a pMOS semiconductor device holes will be provided in the second channel region during the write '1' operation.

Figure 8:
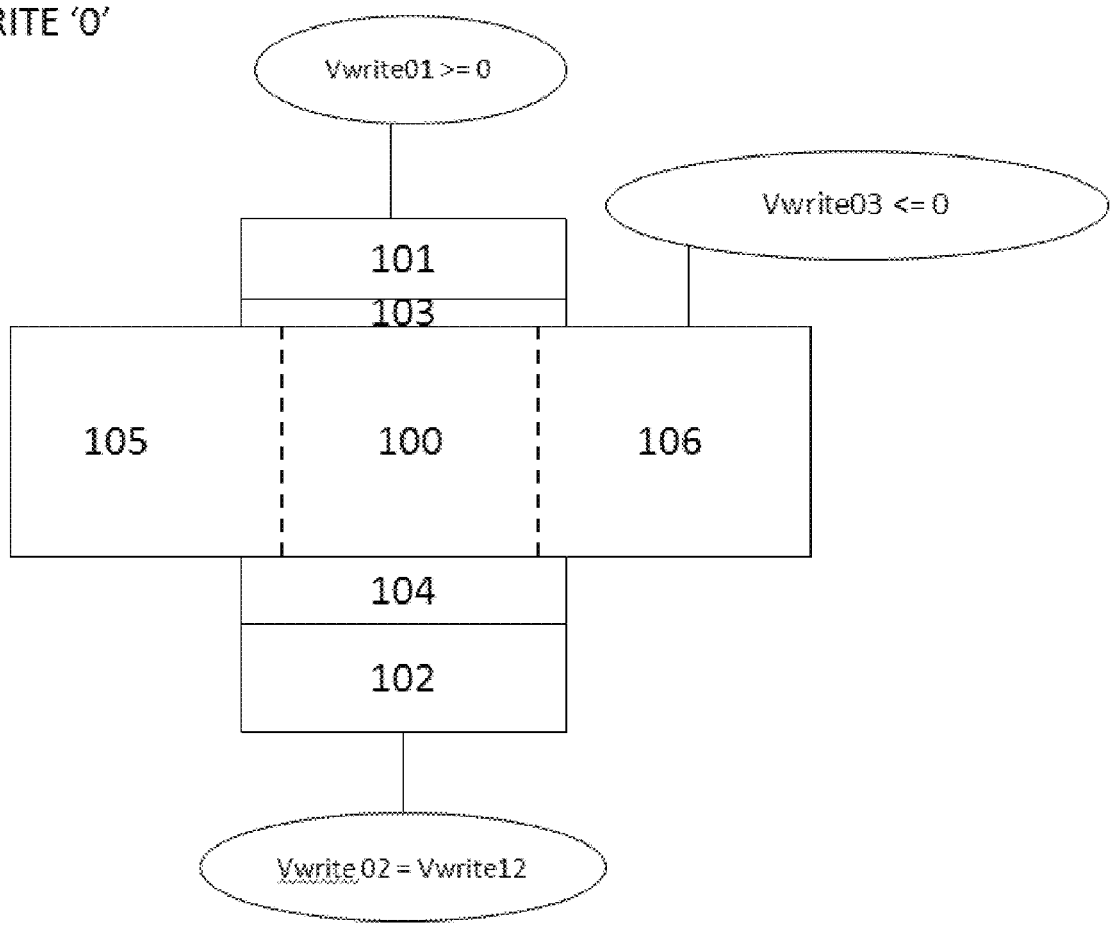
FIG. 8 shows voltages applied to the MOS transistor structure of FIG. 1 to perform a write '0' operation of a semiconductor memory device.

FIG. 8 illustrates a specific voltage scheme for the write '0' mode for an nMOS semiconductor device.

Bringing the first channel region at least into depletion, preferably into inversion mode and keeping the second channel at least in depletion, preferably inversion mode comprises:

applying a write01 voltage>=0V to the first gate electrode applying a write02 voltage being equal to the write12 voltage to the second gate electrode applying a write03 drain (or source) voltage<=0V to the drain (or source region).

Figure 9:
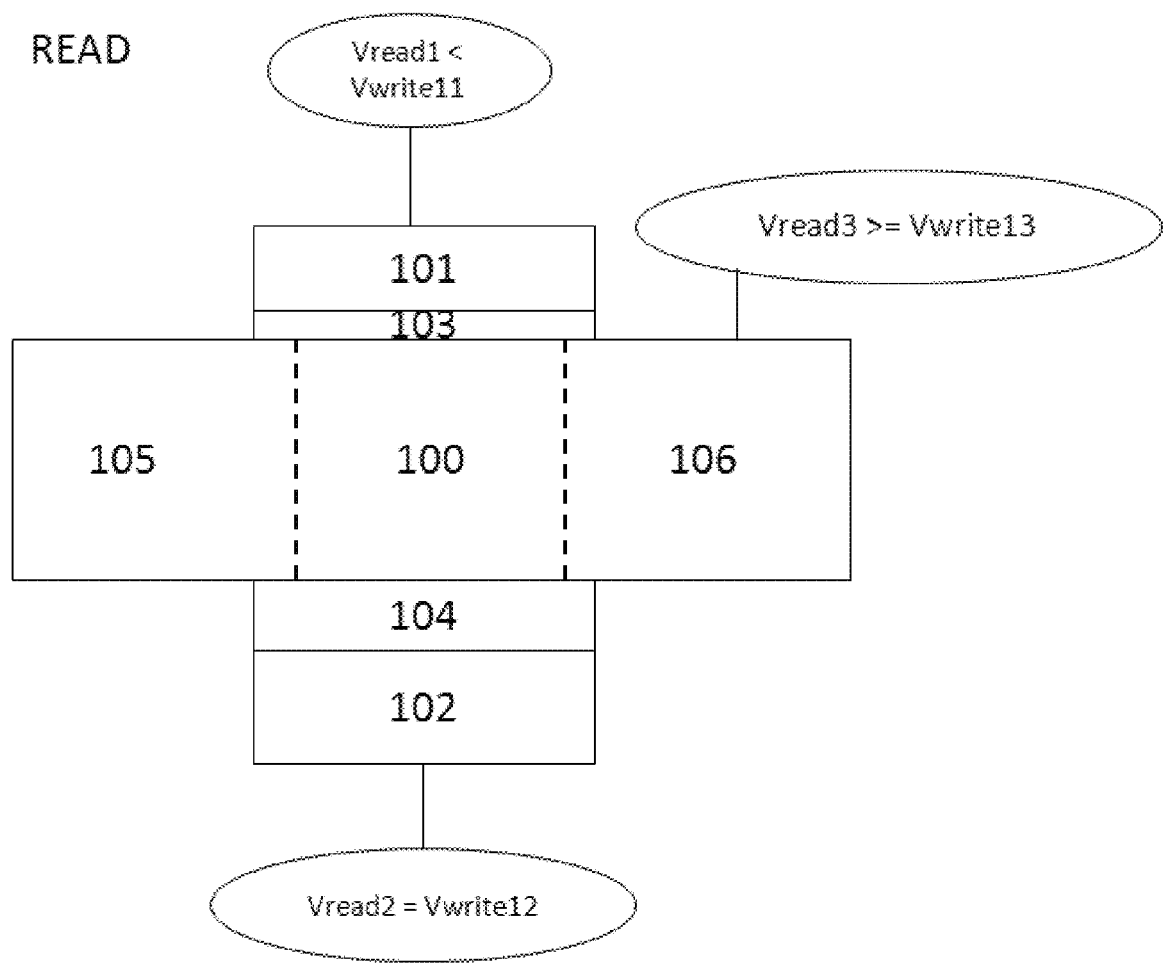
FIG. 9 shows voltages applied to the MOS transistor structure of FIG. 1 to perform a read operation of a semiconductor memory device.

A specific voltage scheme for the read mode for an nMOS semiconductor device is as follows (see FIG. 9).

Performing a read operation comprises:

applying a negative read1 voltage lower than the write11 voltage to the first gate electrode applying a positive read2 voltage being equal to the write12 voltage to the second gate electrode and applying a read3 drain (or source) voltage to the drain (or source) region, the read3 drain (or source) voltage being equal or higher than the write13 drain (or source) voltage.

Figure 10:
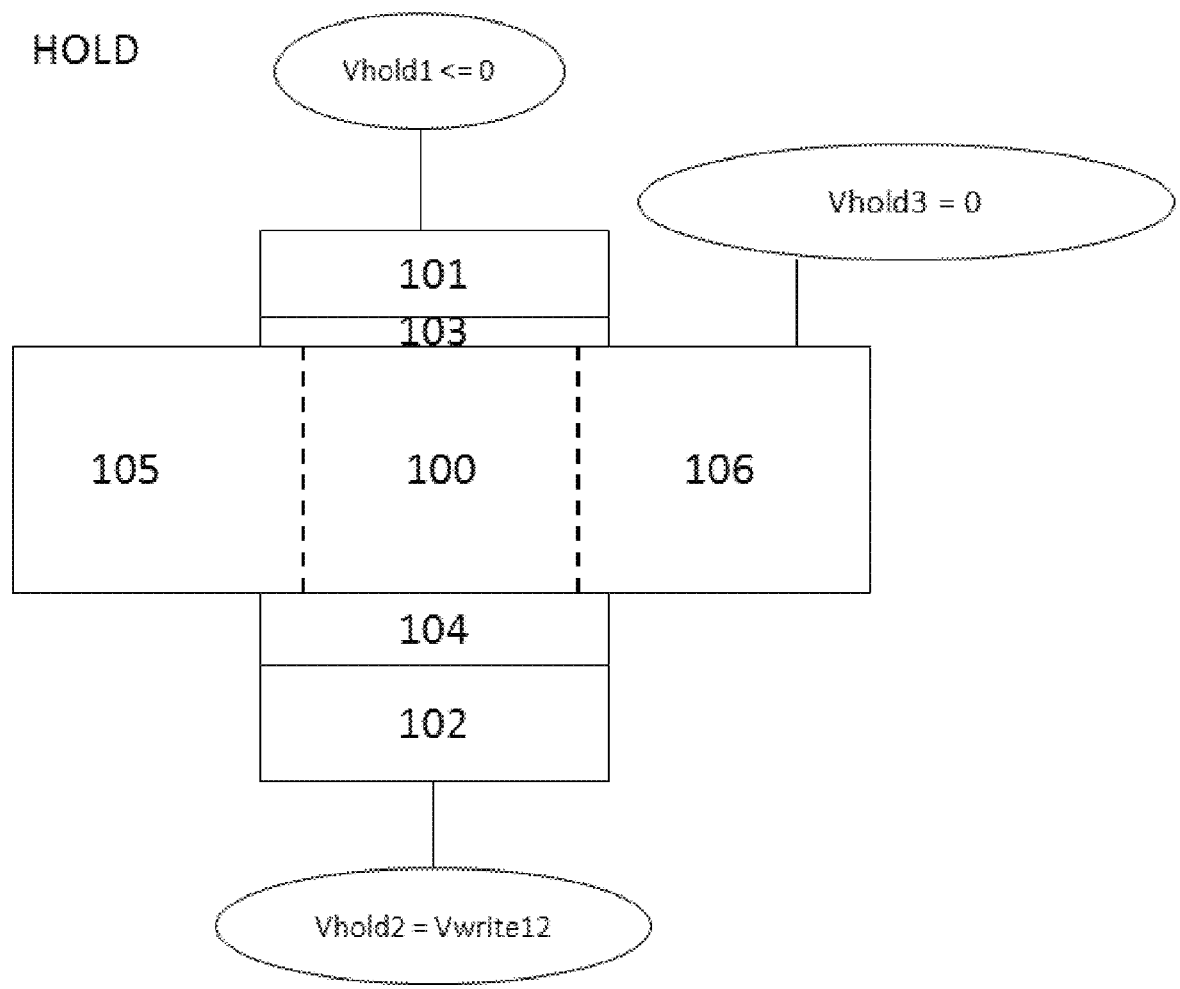
FIG. 10 shows voltages applied to the MOS transistor structure of FIG. 1 to perform a hold operation of a semiconductor memory device.

Referring to FIG. 10, a specific voltage scheme for a hold mode for an nMOS semiconductor device is as follows.

Performing a hold operation comprises:

applying a hold1 voltage to the first gate electrode bringing the first channel region in the accumulation regime.

applying a hold2 voltage to the second gate electrode being equal to the write12 voltage applying a hold3 drain (or source) voltage equal to 0 to drain (or source) region.

The write11 voltage may be in the range of −2 to 0V.
The write12 voltage may be in the range of 0 to 5V.
The write03 voltage may be in the range of 0 to −2V.
The read3 voltage may be in the range of 1.1 to 2.5V.
The hold1 voltage may be in the range of −2 to 0V.

Whilst the above ranges include 0V, and individual of the write voltages may indeed take the value of 0V, a person skilled in the art will understand that not all the write voltages should be 0V simultaneously.

Figure 11A:
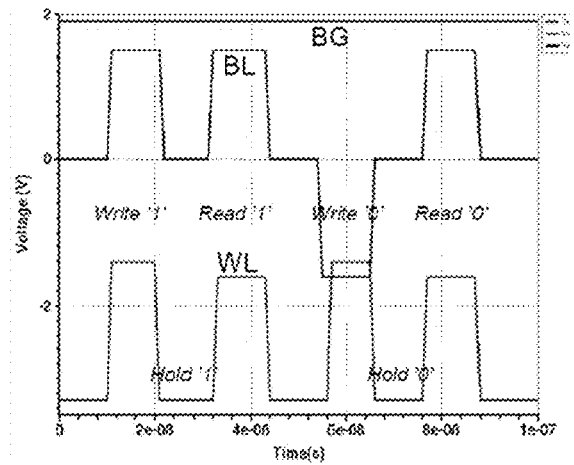
FIG. 11A shows simulated write, read and hold voltages applied to a semiconductor memory device as in FIGS. 7-10.
Figure 11B:
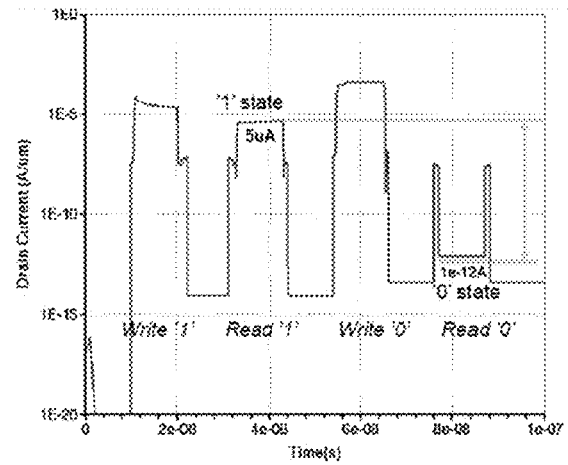
FIG. 11B shows simulated results for drain current in the semiconductor memory device during the write, read and hold operations.

A simulation of the above biasing schemes is shown in FIGS. 11A and 11B. FIG. 11A depicts bias voltages applied over several operation cycles of the device to perform various operations of write, hold, read and so forth, whilst FIG. 11B shows the resulting drain currents.

FIG. 11A shows a back gate voltage $V_{BG}$ corresponding to (in time sequence in this example) the above-mentioned write12, hold2, write02, read2 voltages. A bit line (BL) voltage applied to the device drain provides the above-mentioned signals write13, hold3, write03 (with inverse polarity compared with write13) and read3 voltages. A word line signal WL applied to the front gate provides the voltages write11, hold1, read1, and write01.

FIG. 11B shows the resultant drain currents in this simulation. As can be seen, the write operation can be performed in less than 10 ns. The positive feedback loop referred to earlier allows a write '1' to be effected very quickly; write '0' has a similar duration, though this is limited by the recombination time.

It should be mentioned that the precise values of the different voltages which are applied to the semiconductor device will depend on the device properties such as for example the semiconductor material used, the geometry of the device, and the work function of the gate electrodes. Therefore, any differences between the values assumed for the simulation, and the preferred ranges stated above, are incidental.

The above description has referred to employing a MOS transistor with a hysteresis window as a semiconductor memory device. Although this is an important aspect of the invention, the same device may also be used as a conventional transistor either for its switching function (in logic circuitry) or for its amplifying function (in analog circuitry). This is achieved by suppressing the hysteresis window so that the memory effect does not occur.

To recap, holes generated by weak impact ionization are injected to the channel, thereby lowering the potential barrier. This leads to more $I_{DS}$ and more impact ionization current. This positive feedback results in abrupt increase of subthreshold current, which is advantageous for a semiconductor switch as well as for a semiconductor memory device.

Thus, another embodiment of the present invention provides a method for operating a logic digital and analog semiconductor device, the method comprising:
bringing the first channel region in accumulation mode and the second channel region in depletion or inversion mode comprising:
applying a negative write11 voltage to the first gate electrode
applying a positive write 12 voltage to the second gate electrode
applying a write13 drain voltage to the drain region, the write13 drain voltage being higher than the bandgap of the semiconductor material in the semiconductor body.

It should be noted that in this case, the term "write voltage" does not imply storing charge in the transistor; rather, the term is used for comparison with the semiconductor memory device already described. Rather, the write voltage may be thought of as the voltage required to switch on the transistor.

For a logic digital and/or analog semiconductor device the hysteresis window as is present for a memory semiconductor device is not wanted. FIG. 6 shows how varying $V_{BG}$ allows the size of the hysteresis window to be controlled. Another approach is to reduce $V_{DS}$ so as to suppress the hysteresis effect. Therefore, differently-biasing the devices allows identically-fabricated devices to be used either as semiconductor memory devices or as switches/amplifiers, as required.

Such differently-biased devices can be combined in the same semiconductor circuit (IC). Thus, a further embodiment of the present invention may provide a semiconductor circuit comprising: at least a first semiconductor device with a first biasing means; and at least a second semiconductor device with a second biasing means; the first and the second semiconductor devices having an identical fabrication scheme, whilst the first and second biasing means are different.

The first biasing means for comprises a means for biasing a first semiconductor memory device. The second biasing means comprises a means for biasing a second semiconductor logic device, which can be analog or digital. As is well known in the art, such biasing means employ circuitry for providing suitable supply voltages to circuits comprised of the semiconductor devices. Such circuitry may involve, for example, voltage regulators, level converters, constant-current or constant-voltage circuits, and so forth.

Figure 12:
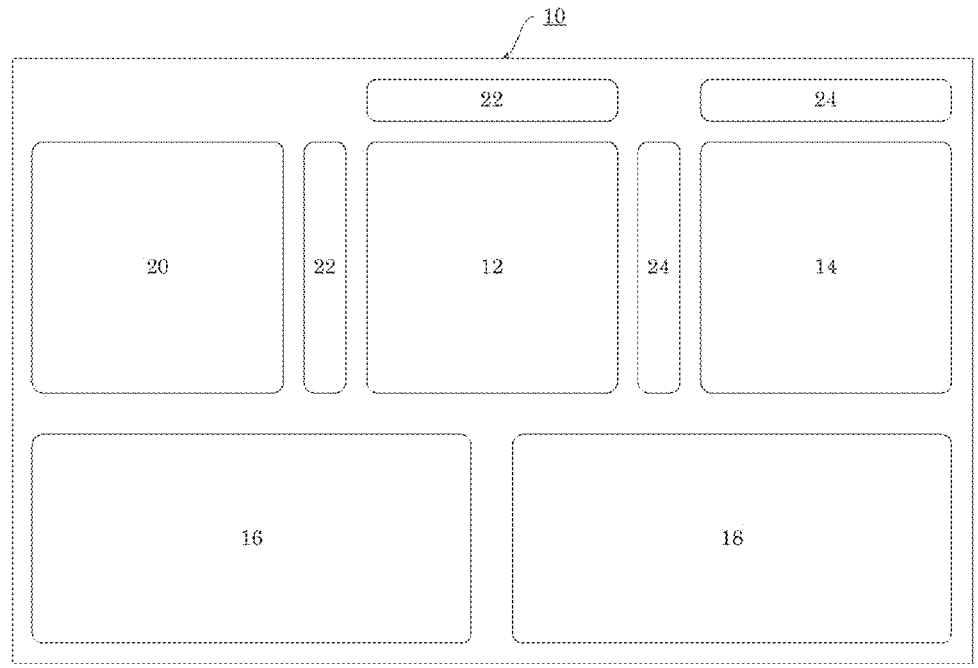
FIG. 12 schematically illustrates an integrated circuit including, in addition to semiconductor memory devices embodying the invention, similarly-fabricated semiconductor devices operated as digital and analog transistors by using alternative biasing schemes.

As shown in FIG. 12, this embodiment offers a possible solution to integrate low-power logic (SS<1 mV/dec), memory and analog devices by only adjusting the bias conditions, not the fabrication processing. In other words the present invention may provide a possible way to integrate low-power logic, memory and analog devices in one technology without tuning the fabrication process.

FIG. 12 shows an integrated circuit 10 on which are laid out various circuit sections including memory cell arrays 12 and 14, logic units 16 and 18, and an analog circuit section 20. These circuit sections are interconnected, and connected to external terminals, by signal lines and supplied with operating voltages by power supply lines, neither of which are shown in the Figure for simplicity.

The memory cell arrays 12 and 14 comprise first semiconductor devices as referred to above, in other words multi-gate transistors operated as capacitorless DRAM in accordance with an embodiment of the present invention. Typically one such transistor will be located at the intersection of each of a large number of word lines extending in a first direction with respective ones of a large number of bit lines extending in a second, perpendicular direction. These memory cell arrays employ first biasing means as referred to above (not shown), for supplying operating voltages to the memory cell arrays suitable to invoke the above $V_T$-feedback loop in the transistors and hysteresis window allowing the above write, read and hold operations to be performed. The memory cell arrays 12 and 14 are controlled by driver and sensing circuitry 22, 24, connected to the word lines and bit lines.

The logic units 16 and 18 comprise second semiconductor devices as discussed above, in other words multi-gate transistors operated as logic transistors. These units are provided with second biasing means (also not shown), for supplying an operating voltages to the logic units suitable to cause the transistors to operate with a small Subthreshold Slope (SS) as described earlier but without the hysteresis window. The analog circuit section comprises further semiconductor devices, fabricated in the same way as the first and second semiconductor devices, but employing further biasing means configured to provide operating voltages to the analog circuit section for operating the devices in a desired analog manner, such as within a linear portion of the $I_D$ vs $V_{FG}$ curve (shown in FIG. 6 for a semiconductor memory device) to amplify signals.

As will be understood by those skilled in the art, the configuration shown in FIG. 12 is greatly simplified over a practical integrated circuit. In reality, memory, logic and analog circuits are more intermingled than indicated in the Figure. For example, the above-mentioned driver and sensing circuitry 22 and 24 may employ transistors operated as logic transistors for generating the signals needed to write data in the semiconductor memory devices, and other transistors operated as analog transistors for use in sense amplifiers to detect read-out data of the semiconductor memory devices. As already mentioned in an embodiment of the present invention all such transistors may be fabricated by the same process, differing only in their bias requirements.

Thus, a further embodiment of the present invention may provide a method for operating a semiconductor circuit comprising a method according to the above for operating a semiconductor memory device, and a method according to the above for operating a semiconductor logic device.

Various modifications are possible within the scope of the present invention.

Reference was made above to a UTBOX FDSOI device, but in general, the proposed biasing schemes can be used on any SOI based and/or double gate MOSFET, e.g. PDSOI, FDSOI, FinFET and VFET. In the absence of UTBOX it may be necessary to apply higher voltages to the back gate, which is less preferable.

The threshold voltage may be not only reduced by use of PDSOI/FDSOI as already mentioned, but also tuned by adjusting the channel doping of a conventional bulk MOS transistor or by adjusting the work function of the gate material. Ultimately, reduction in threshold voltage allows a lower supply voltage for the IC in which the devices are integrated, and thus lower power consumption of the IC.

Likewise, reference was made above to a $V_{DS}$ of 1.5V but this can be further reduced by replacing the channel with material which has small band gap or higher impact ionization rate, e.g. silicon germanium, or III-V materials. By using a low bandgap material, the drain voltage may be reduced to lower values compared to using for example silicon as a semiconducting material. A lower drain voltage is advantageous for the semiconductor device, since device degradation may occur when using high drain voltages.

The second dielectric layer may comprise a buried oxide layer from a semiconductor-on-insulating substrate. The semiconductor device may thus be a SOI-based semiconductor device, either a planar SOI-based semiconductor device or a finFET or multi-gate SOI-based semiconductor device. The use of FDSOI as in the above example is preferred, as this is aligned with industry trends; however a PDSOI may be employed with the channel doping adjusted to tune the body factor. The semiconductor device may also be a bulk semiconductor device. In this case it may be necessary to tune the width of the body and/or vary the gate dielectric material and/or thickness to tune the body factor.

In the case of a PDSOI or FDSOI the back gate need not imply a distinct gate stack formed with regard to each transistor, but instead it may be possible to employ a common contact for multiple transistors or even for all of the transistors in an IC.

In the above examples, transistors with two gates have been considered. However, three or more gates could conceivably be provided. "Multi-gate" refers to two or more gates.

EXAMPLE IMPLEMENTATION

An embodiment of the present invention allows a FBC using a $V_T$-feedback loop to write '1' to be achieved for the first time. Experimental results show that the operation $V_{DS}$ can be reduced to 1.5 v or even lower. Due to low operation $V_{DS}$, endurance up to $10^{16}$ operation cycles is achieved while maintaining fast operation and ~5 s retention time at 85° C. With regard to scalability, the biasing method can relax the requirement of the oxide scaling. Germanium source, which has been widely used in strain CMOS, can be used to reduce operation $V_{DS}$ further.

What is claimed is:

1. A multi-gate metal-oxide-semiconductor (MOS) transistor comprising:
   a first gate associated with a first body factor, wherein the first gate comprises a first gate electrode for applying a first gate voltage, the first gate electrode being in contact with a first dielectric layer;
   a second gate associated with a second body factor greater than or equal to the first body factor, wherein the second gate comprises a second gate electrode for applying a second gate voltage, the second gate electrode being in contact with a second dielectric layer;
   a body of semiconductor material between the first dielectric layer and the second dielectric layer, wherein the semiconductor body has a bandgap and comprises a first channel region located close to the first dielectric layer and a second channel region located close to the second dielectric layer, and wherein the second body factor is sufficient to enable a threshold-voltage-based feedback loop of generation of charge carriers in the body to create a hysteresis window in a variation of drain current with the first gate voltage;
   a source region having a conductivity type different from a conductivity type of the body; and
   a drain region having a conductivity type different from the conductivity type of the body.

2. The multi-gate MOS transistor of claim 1, wherein the multi-gate MOS transistor is configured to operate in a first write operation in which:
   the first gate voltage is applied,
   the second gate voltage is applied, wherein the second gate voltage has opposite polarity from the first gate voltage,
   the first channel region is placed in an accumulation mode,
   the second channel region is placed in one of a depletion mode and an inversion mode, and
   a drain-to-source voltage larger than the bandgap is applied, thereby generating charge carriers by impact ionization and inducing the feedback loop.

3. The multi-gate MOS transistor of claim 2, wherein the multi-gate MOS transistor is configured to operate in a second write operation in which:
   the first gate voltage is applied,
   the second gate voltage is applied, wherein the second gate voltage has opposite polarity from the first gate voltage,
   the first channel region is placed in one of a depletion mode and an inversion mode,
   the second channel region is placed in one of a depletion mode and an inversion mode, and
   a forward-biasing drain-to-source voltage is applied.

4. The multi-gate MOS transistor of claim 1, wherein the multi-gate MOS transistor is configured to operate in a read operation in which:
   the first gate voltage is applied within the hysteresis window in a variation of drain current with the first gate voltage,
   the second gate voltage is applied, wherein the second gate voltage has opposite polarity from the first gate voltage,
   the first channel region is placed in an accumulation mode,
   the second channel region is placed in one of a depletion mode and an inversion mode, and
   a drain voltage is applied that is larger than the bandgap.

5. The multi-gate MOS transistor of claim 1, wherein the multi-gate MOS transistor is configured to operate in a hold operation in which:
   the first gate voltage is reduced below a threshold voltage of the MOS transistor,
   the second gate voltage is applied, wherein the second gate voltage has opposite polarity from the first gate voltage, and the second channel region is placed in one of a depletion mode and an inversion mode, wherein substantially no voltage difference is present between the source terminals and the drain terminals.

6. The multi-gate MOS transistor of claim 1, wherein:
the first body factor is based on a capacitance of the first gate; and
the second body factor is based on a capacitance of the second gate.

7. The multi-gate MOS transistor of claim 1, wherein the second body factor is at least 0.8.

8. The multi-gate MOS transistor of claim 1, wherein the semiconductor material comprises at least one of a low-bandgap material, silicon, and silicon germanium.

9. The multi-gate MOS transistor of claim 1, wherein:
the second dielectric layer comprises a buried oxide layer in a semiconductor-on-insulator substrate; and
the second gate comprises one of a back gate and a substrate contact of the multi-gate MOS transistor.

10. The multi-gate MOS transistor of claim 1, wherein the multi-gate MOS transistor comprises at least one of:
a fully-depleted silicon-on-insulator device,
a semiconductor memory,
a bulk semiconductor device,
a planar semiconductor-on-insulator device in which the first gate electrode and the second gate electrode are parallel to a substrate of the multi-gate MOS transistor, and
a fin field-effect transistor (finFET) device in which the first gate electrode and the second gate electrode are perpendicular to a substrate of the multi-gate MOS transistor.

11. A method comprising:
providing a multi-gate metal-oxide-semiconductor (MOS) transistor having a threshold voltage, the multi-gate MOS transistor comprising:
a first gate associated with a first body factor, wherein the first gate comprises a first gate electrode for applying a first gate voltage, the first gate electrode being in contact with a first dielectric layer,
a second gate associated with a second body factor greater than or equal to the first body factor, wherein the second gate comprises a second gate electrode for applying a second gate voltage, the second gate electrode being in contact with a second dielectric layer,
a body of semiconductor material between the first dielectric layer and the second dielectric layer, wherein the semiconductor body has a bandgap and comprises a first channel region located close to the first dielectric layer and a second channel region located close to the second dielectric layer, and wherein the second body factor is sufficient to enable a threshold-voltage-based feedback loop of generation of charge carriers in the body to create a hysteresis window in a variation of drain current with the first gate voltage,
a source region having a conductivity type different from a conductivity type of the body, and
a drain region having a conductivity type different from the conductivity type of the body; and
performing a first write operation, wherein the first write operation comprises:
placing the first channel region in an accumulation mode, and
placing the second channel region in one of a depletion mode and an inversion mode;
performing a second write operation, wherein the second write operation comprise:
placing the first channel region in one of a depletion mode and an inversion mode, and
placing the second channel region in one of a depletion mode and an inversion mode;
performing a read operation, wherein the read operation comprises:
placing the first channel region in an accumulation mode, and
placing the second channel region in one of a depletion mode and an inversion mode; and
performing a hold operation, wherein the hold operation comprises:
reducing the first gate voltage below the threshold voltage, and
placing the second channel region in one of a depletion mode and an inversion mode.

12. The method of claim 11, wherein the second gate voltage applied during each of performing the first write operation, performing the second write operation, performing the read operation, and performing the hold operation is substantially the same voltage.

13. The method of claim 11, wherein a first gate voltage applied during the read operation is one of:
more negative than a first gate voltage applied during the second write operation, and
more positive than a first gate voltage applied during the first write operation.

14. The method of claim 11, wherein the multi-gate MOS transistor comprises an nMOS transistor, wherein performing the first write operation further comprises:
applying a first write voltage to the first gate electrode, wherein the first write voltage is a negative voltage that is higher than a trigger voltage at which a threshold slope occurs in the variation of drain current with the first gate voltage;
applying a second write voltage to the second gate electrode, wherein the second write voltage is a positive voltage; and
applying a third write voltage as a source-and-drain voltage larger than the bandgap, thereby generating charge carriers by impact ionization and inducing the threshold-voltage-based feedback loop.

15. The method of claim 14, wherein performing the second write operation further comprises:
applying a fourth write voltage to the first gate electrode, wherein the fourth write voltage is a positive voltage;
applying a fifth write voltage to the second gate electrode, wherein the fifth write voltage is substantially equal to the second write voltage; and
applying a sixth write voltage as a source-and-drain voltage, wherein the sixth write voltage is a negative voltage.

16. The method of claim 14, wherein performing the read operation further comprises:
applying a first read voltage to the first gate electrode, wherein the first read voltage is lower than the first write voltage;
applying a second read voltage to the second gate electrode, wherein the second read voltage is substantially equal to the second write voltage; and
applying a third read voltage as a source-to-drain voltage, wherein the third read voltage is greater than or equal to the third write voltage.

17. The method of claim 14, wherein performing the hold operation further comprises:
applying a first hold voltage to the first gate electrode;
applying a second hold voltage to the second gate electrode, wherein the second hold voltage is substantially equal to the second write voltage; and
applying a third hold voltage as a source-and-drain voltage, wherein the third hold voltage is substantially zero.

18. The method of claim 11, wherein the multi-gate MOS transistor comprises a semiconductor memory, wherein:
the first write operation comprises writing a 1 into the semiconductor memory; and
the second write operation comprises writing a 0 into the semiconductor memory.

19. A method comprising:
providing a plurality of multi-gate metal-oxide-semiconductor (MOS) transistors having respective threshold voltages, each multi-gate MOS transistor comprising:
a first gate associated with a first body factor, wherein the first gate comprises a first gate electrode for applying a first gate voltage, the first gate electrode being in contact with a first dielectric layer,
a second gate associated with a second body factor greater than or equal to the first body factor, wherein the second gate comprises a second gate electrode for applying a second gate voltage, the second gate electrode being in contact with a second dielectric layer,
a body of semiconductor material between the first dielectric layer and the second dielectric layer, wherein the semiconductor body has a bandgap and comprises a first channel region located close to the first dielectric layer and a second channel region located close to the second dielectric layer, and wherein the second body factor is sufficient to enable a threshold-voltage-based feedback loop of generation of charge carriers in the body to create a hysteresis window in a variation of drain current with the first gate voltage,
a source region having a conductivity type different from a conductivity type of the body, and
a drain region having a conductivity type different from the conductivity type of the body; and
operating a first set of the plurality of multi-gate MOS transistors as logic devices, wherein operating a multi-gate MOS transistor as a logic device comprises:
placing the first channel region in an accumulation mode;
placing the second channel region in one of a depletion mode and an inversion mode;
applying a negative write voltage to the first gate electrode;
applying a positive write voltage to the second gate electrode; and
applying a drain-to-source voltage higher than the bandgap.

20. The method of claim 19, further comprising:
operating a second set of the plurality of multi-gate MOS transistors as memory devices.

* * * * *